(12) United States Patent
Hirano et al.

(10) Patent No.: US 6,388,276 B1
(45) Date of Patent: May 14, 2002

(54) REVERSE CONDUCTING THYRISTOR

(75) Inventors: Noritoshi Hirano; Yoshihiro Yamaguchi, both of Fukuoka; Katsumi Satoh, Tokyo, all of (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/824,090

(22) Filed: Apr. 3, 2001

(30) Foreign Application Priority Data

Jul. 27, 2000 (JP) ........................................ 2000-226985

(51) Int. Cl.[7] ........................ H01L 29/74; H01L 31/111
(52) U.S. Cl. ........................................ 257/121; 257/127
(58) Field of Search ........................ 257/115, 127, 257/121, 138, 144, 149

(56) References Cited

U.S. PATENT DOCUMENTS 4,791,470 A * 12/1988 Shinohe et al. ............... 357/38
5,345,095 A * 9/1994 Niwayama .................... 257/138
5,682,044 A * 10/1997 Tamamushi et al. ........ 257/147
6,091,086 A * 7/2000 Zommer ...................... 257/121

FOREIGN PATENT DOCUMENTS

JP 62-57250 3/1987
JP 07-86567 3/1995

* cited by examiner

*Primary Examiner*—David Nelms
*Assistant Examiner*—Long K. Tran
(74) *Attorney, Agent, or Firm*—Oblon, Spivak, McClelland, Maier & Neustadt, P.C.

(57) ABSTRACT

Providing a reverse conducting thyristor, wherein a diode and a GTO thyristor are reverse parallel-connected, with which it is possible to reduce a surface area size of a separation portion and avoid variations in insulation characteristics.

A separation portion between a diode and a GTO thyristor includes a semiconductor substrate of a first conductivity type, a thin film region of a second conductivity type formed in a major surface of the semiconductor substrate, and a guard ring region of the second conductivity type.

9 Claims, 9 Drawing Sheets

REVERSE CONDUCTING THYRISTOR

BACK GROUND OF THE INVENTION

The present invention relates to a reverse conducting thyristor, and more particularly, to a reverse conducting thyristor in which a gate turnoff thyristor and a diode are connected in reverse parallel to each other.

In general, in a reverse conducting thyristor, a gate turnoff thyristor (hereinafter referred to a "GTO thyristor") and a free wheel diode are connected in reverse parallel to each other. FIG. 8 is a cross sectional view of a conventional reverse conducting thyristor generally indicated by the reference numeral 500. The reverse conducting thyristor comprises a diode portion denoted at A in FIG. 8, a GTO thyristor portion denoted at B in FIG. 8, and a separation portion denoted at C sandwiched between these two portions.

In this reverse conducting thyristor, a p layer 502 whose film thickness is about 90 μm is formed on a first major surface of an N⁻ silicon substrate 501 with the first major surface and a second major surface. For electrical separation between the diode portion A and the GTO thyristor portion B, the p layer 502 of the separation portion C is etched in the form of a groove, about 60 μm in depth and about 5 mm in width. This makes a resistance value between the diode portion A and the GTO thyristor portion B about 300 through 500Ω. An n layer 503 is further formed on the p layer 502 in the GTO thyristor portion B.

On the other hand, an n⁺ layer 504 is formed on a second major surface of the n⁻ silicon substrate 501, and a p layer 505 and an n⁺⁺ layer 506 are formed on the n⁺ layer 504.

Further, a cathode electrode 510 is disposed on the n layer 503 in the GTO thyristor portion B, and a gate electrode 511 is disposed on the p layer 502. In addition, a cathode electrode 512 is disposed on the p layer 502 in the diode portion A.

Meanwhile, an anode electrode 513 is disposed on the second major surface of the n⁻ silicon semiconductor substrate 501, as a common electrode for the diode portion A and the GTO thyristor portion B.

FIG. 9 is a circuitry diagram of the reverse conducting thyristor 500. The p layer 502 and the n⁺ layer 504 shown in FIG. 8 form the diode portion, while the n layer 503, the p layer 502, the n⁺ layer 504 and the p layer 505 form the GTO thyristor portion.

However, in the reverse conducting thyristor 500, a surface area size of the separation portion C separating the diode portion A from the GTO thyristor portion B is large, which is an obstacle against a size reduction of the reverse conducting thyristor 500. In addition, when a plurality of reverse conducting thyristors 500 are to be fabricated on a large wafer, the p layers 502 are etched unevenly in terms of depth within the wafer, and therefore, insulation characteristics of the separation portions C are not uniform.

SUMMARY OF THE INVENTION

It is an object of the present invention to provide a reverse conducting thyristor wherein a separation portion is small in surface area size and insulation characteristics is uniform.

The present invention is directed to a reverse conducting thyristor in which a diode and a thyristor are reverse parallel-connected and formed on the same substrate, comprising: a semiconductor substrate of a first conductivity type; a diode region of a second conductivity type of said diode, formed in a major surface of said semiconductor substrate; and a base region of the second conductivity type of said thyristor, formed in said major surface of said semiconductor substrate so as to be separated from said diode region of the second conductivity type by a separation region, wherein said separation region includes a thin film region of the second conductivity type formed in said major surface of said semiconductor substrate and a guard ring region of the second conductivity type.

In this reverse conducting thyristor, the separation portion has a small surface area size and variations in insulation characteristics at the separation portion are reduced. Further, with the thin film region formed in the separation portion, it is possible to prevent destruction of the element due to concentration of a leak current.

A distance between said guard ring region and said diode region of the second conductivity type and a distance between said guard ring region and said base region of the second conductivity type are both preferably 30 μm or smaller. This is for increasing the breakdown voltage of the reverse conducting thyristor.

The depth of said guard ring region is preferably smaller than the depth of said diode region of the second conductivity type and the depth of said base region of the second conductivity type.

It is preferable that two or more such guard ring regions are formed. This is for obtaining sufficient insulation characteristics at the separation portion.

A distance between said guard ring regions is preferably 30 μm or smaller. This is for increasing the breakdown voltage of the reverse conducting thyristor.

The depth of said thin film region is preferably 10 μm or smaller. This is for obtaining sufficient insulation characteristics at the separation portion.

A concentration of an impurity of the second conductivity type contained in said thin film region is preferably lower than concentrations of impurities of the second conductivity type contained in said diode region of the second conductivity type and said base region of the second conductivity type.

A concentration of an impurity of the second conductivity type contained in said guard ring region is preferably higher than concentrations of impurities of the second conductivity type contained in said diode region of the second conductivity type and said base region of the second conductivity type.

It is preferable that concentrations of impurities of the second conductivity type contained in said guard ring region, said diode region and said base region of the second conductivity type, and said thin film region are progressively lower in this order.

As clearly described above, with the reverse conducting thyristor according to the present invention, it is possible to reduce the surface area size of the separation portion, and hence, to form the element in a small size.

Also, during fabrication of a plurality of such reverse conducting thyristors on a wafer, it is possible to reduce variations in insulation characteristics of the separation portion, and hence, to ensure that element characteristics are uniform.

Further, it is possible to prevent destruction of the element due to a leak current, and hence, to improve a production yield of the reverse conducting thyristors.

DETAILED DESCRIPTION OF THE PREFERRED EMBODIMENTS

Figure 1:
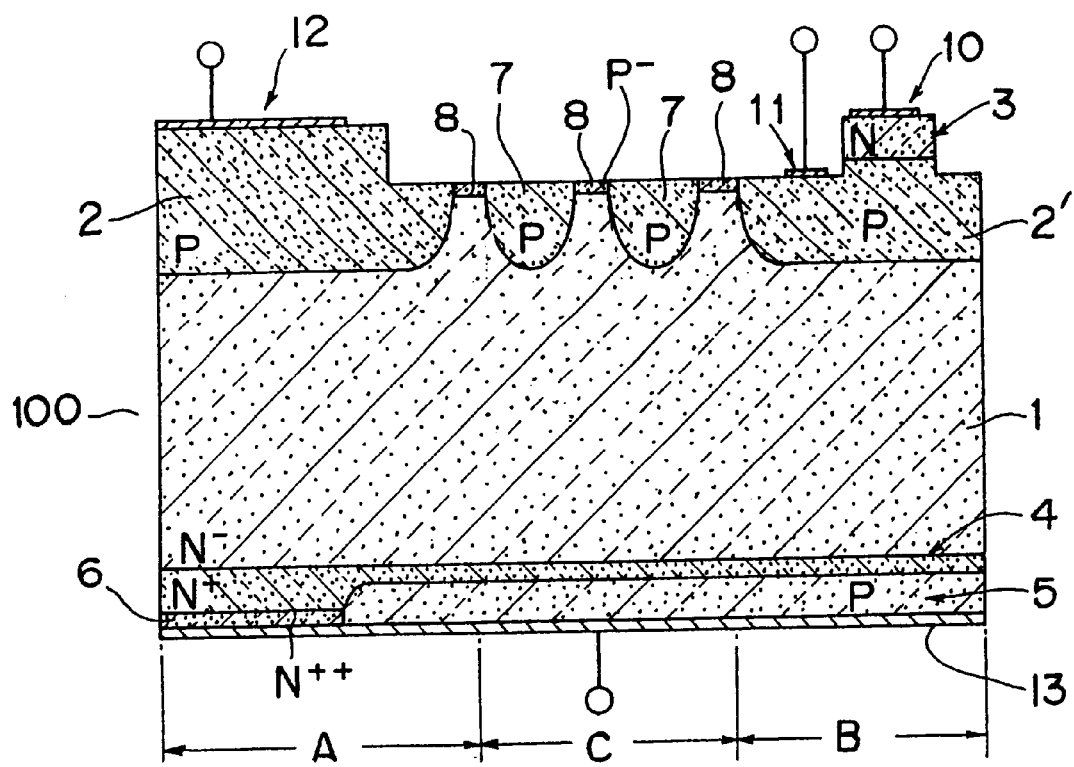
FIG. 1 is a cross sectional view of the reverse conducting thyristor according to the preferred embodiment of the present invention.

FIG. 1 is a cross sectional view of a reverse conducting thyristor according to a preferred embodiment. In the following, a structure of the reverse conducting thyristor will be described while referring to manufacturing steps.

Describing the reverse conducting thyristor generally indicated by the reference numeral 100, first, an n⁻ silicon semiconductor substrate 1 with a first major surface and a second major surface is prepared. An impurity concentration of an n-type impurity in the semiconductor substrate 1 is about $7 \times 10^{12}$ atom/cm³.

In a diode portion A, a p layer 2 is formed by diffusing or the like on the first major surface of the semiconductor substrate 1. An impurity concentration of a p-type impurity in the p layer 2 is about $1 \times 10^{16}$ atom/cm³ to $7 \times 10^{16}$ atom/cm³, and preferably, about $4 \times 10^{16}$ atom/cm³.

In a GTO thyristor portion B, a p base layer 2' and an n cathode layer 3 are successively formed on the first major surface. An impurity concentration of a p-type impurity in the p base layer 2' is approximately the same as that of the p layer 2. Meanwhile, an impurity concentration of an n-type impurity in the n cathode layer 3 is about $5 \times 10^{19}$ atom/cm³.

Then, a region including the separation region C is etched, thereby exposing the p base layer 2' below the n cathode layer 3.

On the other hand, an n⁺ layer 4 is formed by diffusing or the like in the second major surface of the semiconductor substrate 1. Following this, an n⁺⁺ layer 6 and the p layer 5 are formed on the n⁺ layer 4. The n⁺ layer 4 and the n⁺⁺ layer 6 function as an n-side region of the diode portion A and also as an n base region of the GTO thyristor portion B. An impurity concentration of an n-type impurity in the n⁺ layer 4 is about $3 \times 10^{15}$ atom/cm³, an impurity concentration of an n-type impurity in the n⁺⁺ layer 6 is about $1 \times 10^{20}$ atom/cm³, and an impurity concentration of a p-type impurity in the p layer 5 is about $1 \times 10^{18}$ atom/cm³.

Then, in the separation portion B, p-type guard ring regions 7 are formed by diffusing or the like in the first major surface of the semiconductor substrate 1. An impurity concentration of a p-type impurity in the guard ring regions 7 is about $1 \times 10^{16}$ atom/cm³ to $1 \times 10^{17}$ atom/cm³, and preferably, about $5 \times 10^{16}$ atom/cm³.

With more p-type guard ring regions 7 formed, it is possible to enhance insulation between the p layer 2 and the p base layer 2'. On the other hand, increasing the number of the guard ring regions 7 results in an increase in width of the separation portion C. Noting this, the number of the guard ring regions 7 is preferably set to an appropriate number. In this embodiment, there are two guard ring regions 7 formed.

Then, p thin film regions 8 are formed by diffusing or the like on the first major surface of the semiconductor substrate 1 exposed to the surface of the separation portion C. An impurity concentration of a p-type impurity in the thin film regions 8 is about $5 \times 10^{15}$ atom/cm³ to $5 \times 10^{16}$ atom/cm³, and preferably, is about $1 \times 10^{16}$ atom/cm³.

At last, a cathode electrode 12 is disposed on the p layer 2 in the diode portion A, a gate electrode 11 is disposed on the p base layer 2' in the GTO thyristor portion B, and a cathode electrode 10 is disposed on the n cathode layer 3. On the other hand, an anode electrode 13 is disposed on the second major surface of the semiconductor substrate 1, as a common electrode for the diode portion A and the GTO thyristor portion B.

In this manner, in the reverse conducting thyristor according to the preferred embodiment, discrete insulating by means of the guard ring regions 7 in the separation portion C makes it possible to decrease the size of the separation portion C. Further, it is possible to largely decrease variations in insulation characteristics (resistance value) of the separation portion C.

Meanwhile, Japanese Patent Application Laid-Open Publication No. 7-86567 describes a structure that only the guard ring regions are formed in the separation portion C.

However, in the case of the structure with only the guard ring regions, as a defect within the guard ring regions or the like deteriorates an insulation capability of the guard ring regions, there is a problem when a leak current is created. That is, a leak current flows concentrated in the vicinity of the surfaces of the semiconductor substrate 1 between the guard ring regions 7 and the p layer 2, for example, which in turn leads to destruction of the element. In particular, even when the quantity of the leak current is extremely small so that the reverse conducting thyristor remains still usable, due to destruction of the element induced by the concentration of the leak current, the reverse conducting thyristor eventually becomes unusable in some cases.

Therefore, the reverse conducting thyristor according to the preferred embodiment requires to form the thin film regions 8 of the p type, so that when a leak current is generated, the leak current flows inside the thin film regions 8. This makes it possible to prevent concentration of the leak current which occurs in the case of the conventional techniques, and hence, to prevent current concentration from destroying the element.

EXAMPLE 1

Figure 2:
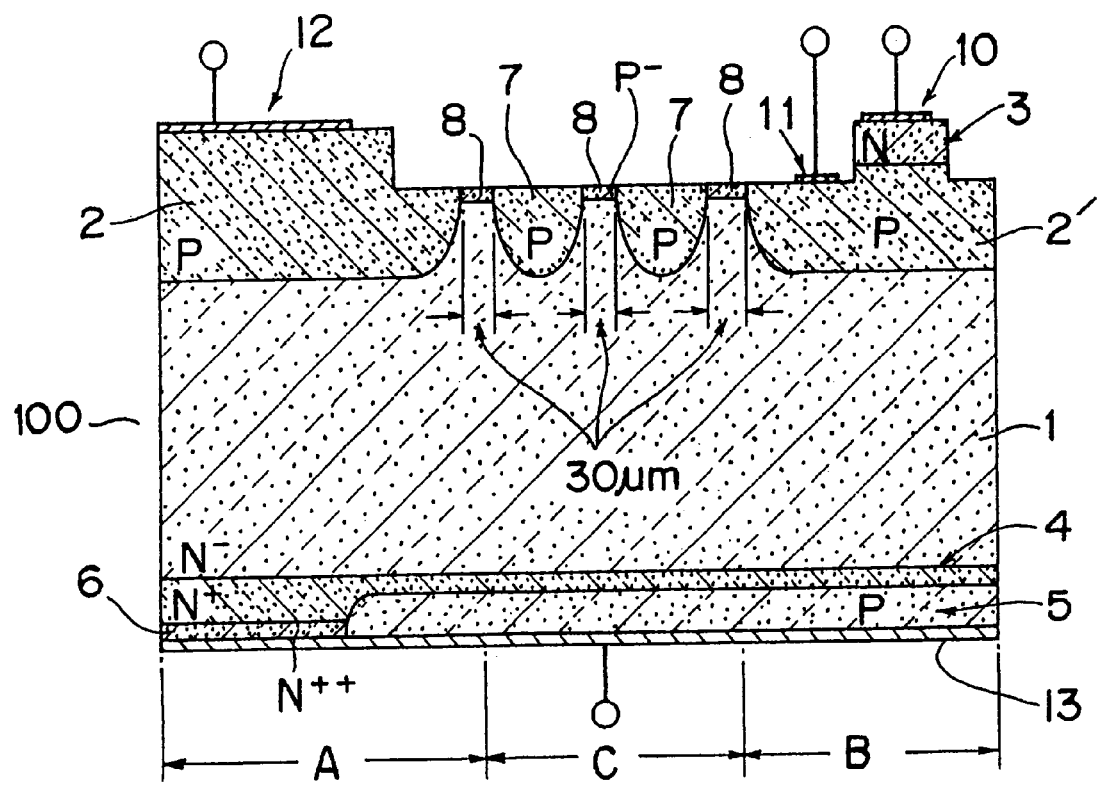
FIG. 2 is a cross sectional view of the reverse conducting thyristor according to the first example of the present invention.

FIG. 2 shows a first example of the invention. A structure of a reverse conducting thyristor 100 is the same as that of the thyristor shown in FIG. 1. In the reverse conducting thyristor 100 shown in FIG. 2, the separation portion C includes two guard ring regions 7. Further, a gap between the guard ring region 7 and the p layer 2, a gap between the guard ring region 7 and the p base layer 2', and a gap between the two guard ring regions 7 are respectively 30 μm.

Figure 3:
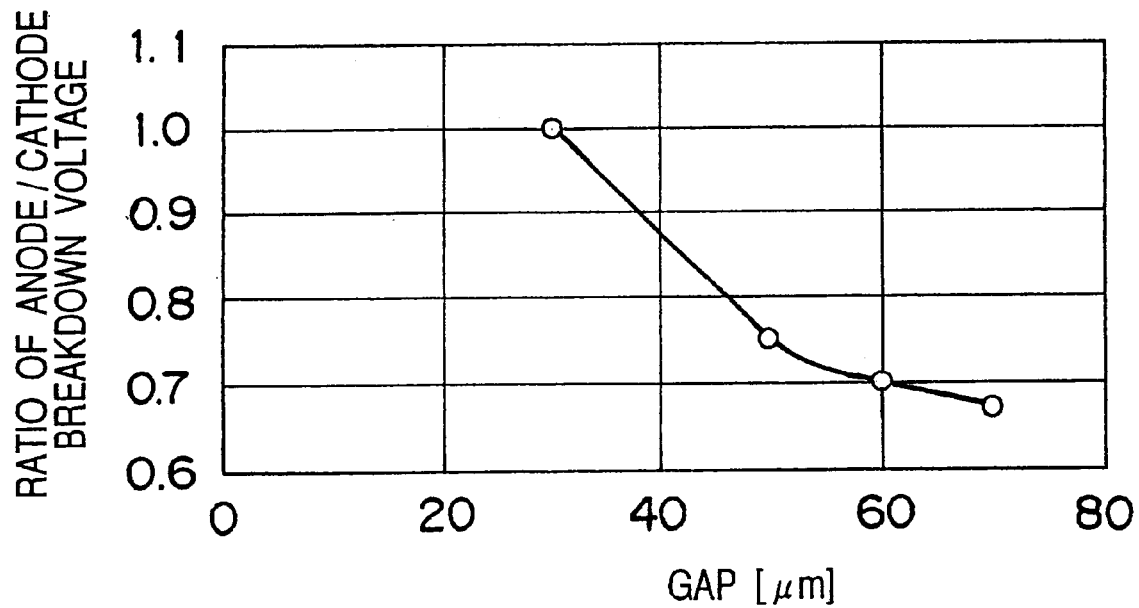
FIG. 3 shows the relationship between the gaps between the p-type regions and the breakdown voltage.

FIG. 3 shows a relationship between the gaps between the guard ring regions 7 and the p layer 2 and the like and a breakdown voltage between the anode electrode and the cathode electrode. The breakdown voltage between the anode electrode and the cathode electrode is expressed as a ratio assuming that a breakdown voltage is 1 when the gaps between the guard ring regions 7 and the p layer 2 and the like are 30 μm. As is clear from FIG. 3, the breakdown voltage decreases as the gaps exceed 30 μm. When the gaps are 50 μm or narrower, in particular, the breakdown voltage decreases as much as 25%.

Hence, as shown in FIG. 2, the gaps between the guard ring regions 7 and the p layer 2 and the like are preferably 30 μm or smaller.

EXAMPLE 2

Figure 4:
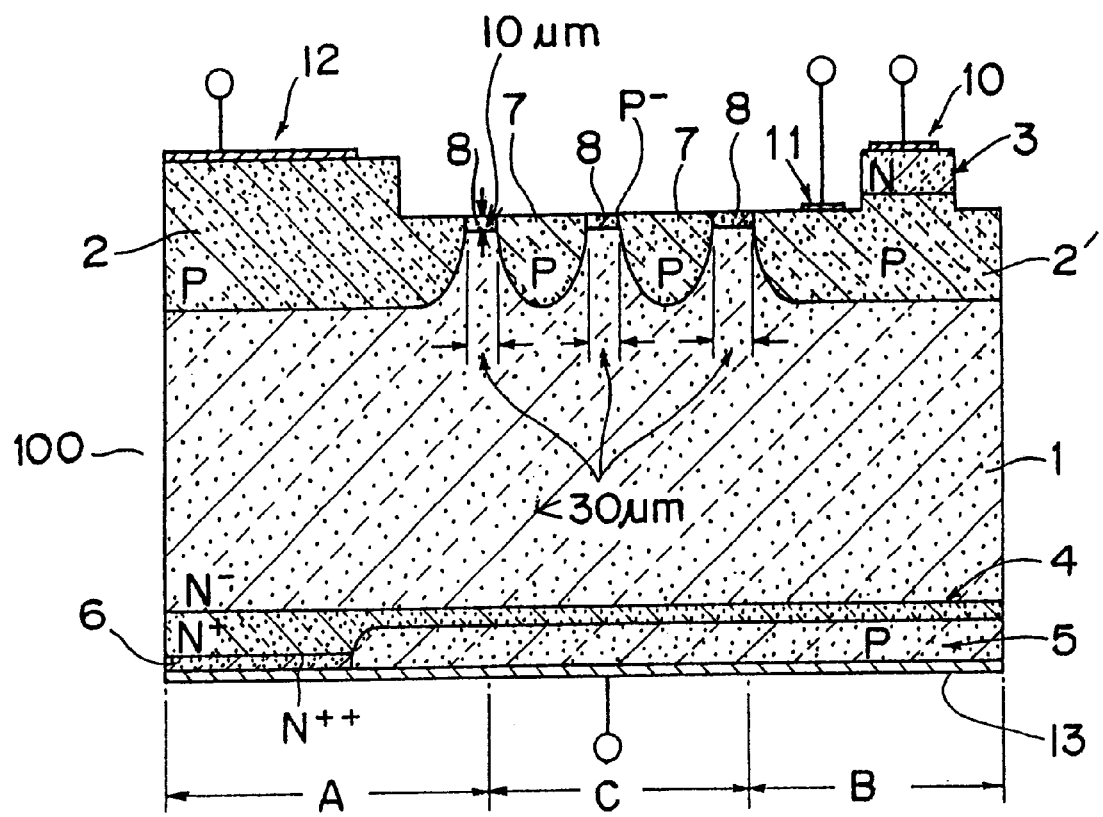
FIG. 4 is a cross sectional view of the reverse conducting thyristor according to the second example of the present invention.

FIG. 4 shows a second example of the invention. A structure of a reverse conducting thyristor 100 is the same as that of the thyristor shown in FIG. 1. In the reverse conducting thyristor 100 shown in FIG. 4, the separation portion C includes two guard ring regions 7. The gaps between the guard ring regions 7 and the p layer 2 and the like are respectively 30 μm.

Figure 5:
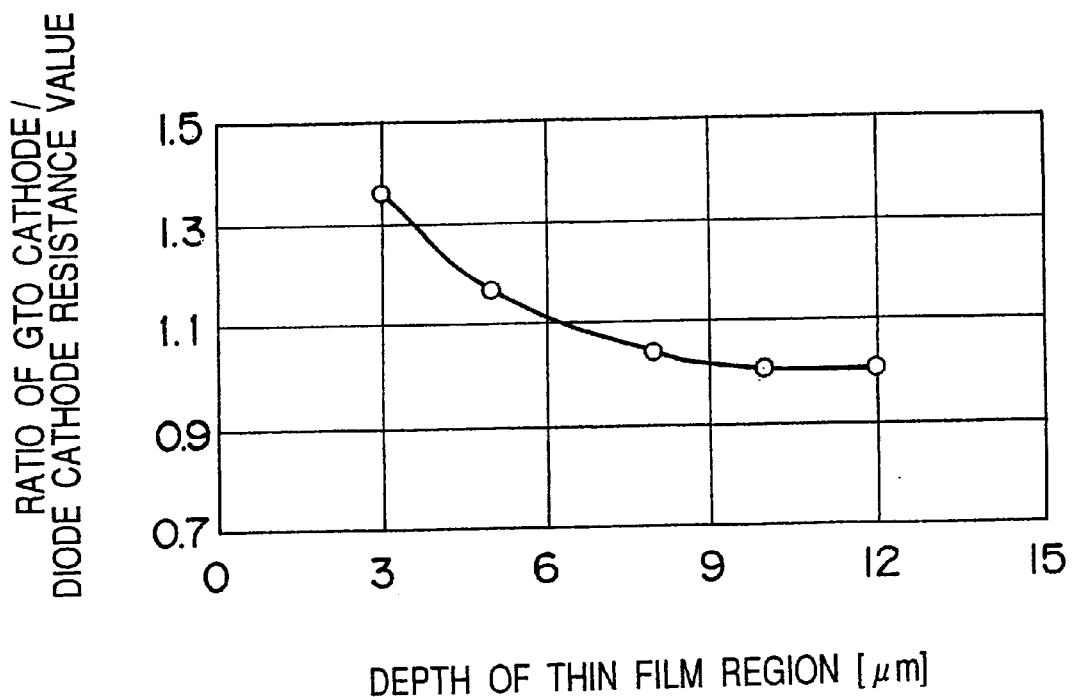
FIG. 5 shows the relationship between the depth of the thin film regions and the resistance value.

FIG. 5 shows a relationship between the depth of the thin film regions 8 and a resistance between the cathode electrode 12 of the diode and the cathode electrode 10 of the GTO thyristor. The resistance is expressed as a ratio assuming that a resistance is 1 when the depth of the thin film regions 8 is 10 μm.

As is clear from FIG. 5, the resistance value gradually increases as the depth of the thin film regions 8 becomes smaller than about 10 μm. On the other hand, when the depth is about 10 μm or larger, the resistance value is approximately constant.

Hence, in order to obtain excellent insulation characteristics at the separation portion C, the depth of the thin film regions 8 is preferably 10 μm or smaller.

Figure 6:
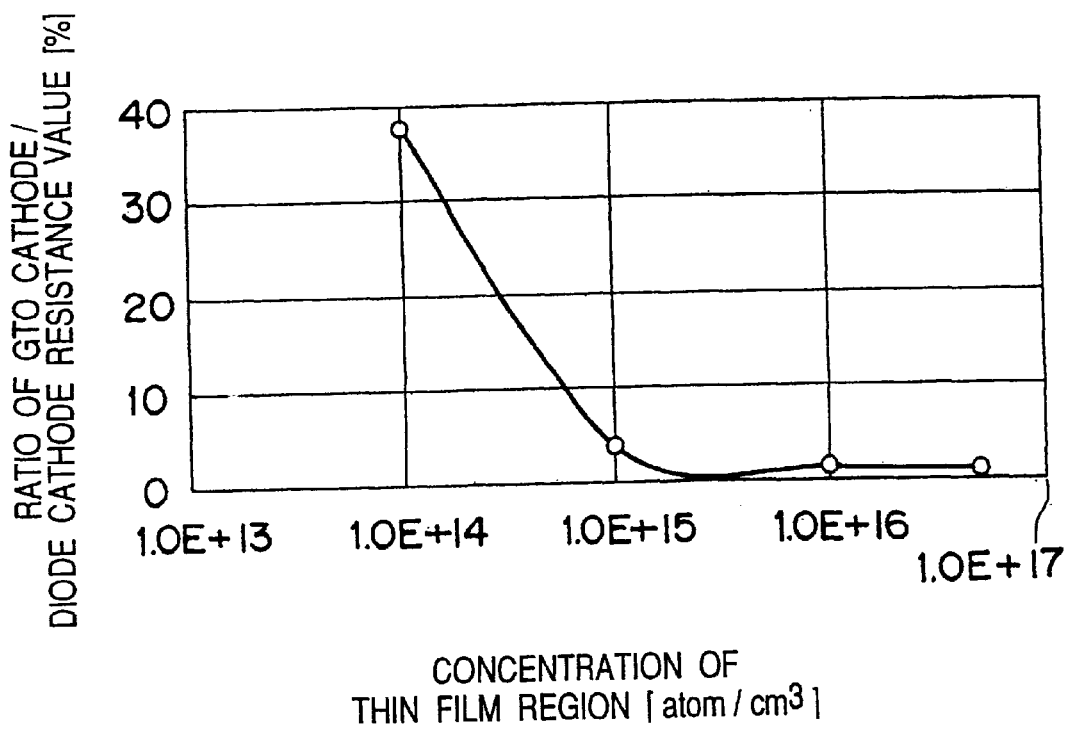
FIG. 6 shows the relationship between the concentration of the thin film regions and the resistance value.

Meanwhile, FIG. 6 shows a relationship between a concentration of the thin film regions 8 and the resistance between the cathode electrode 12 of the diode and the cathode electrode 10 of the GTO thyristor. The resistance is expressed in percentage (%) of an increase from a reference resistance value assuming when the concentration of the thin film regions 8 is $5 \times 10^{16}$ atom/cm$^3$.

As is clear from FIG. 6, it is possible to increase the resistance value of the thin film regions 8 as the concentration of the p-type impurity in the thin film regions 8 is lower.

Hence, in order to obtain excellent insulation characteristics at the separation portion C, the concentration of the thin film regions 8 is preferably $5 \times 10^{16}$ atom/cm$^3$ or lower.

EXAMPLE 3

Figure 7:
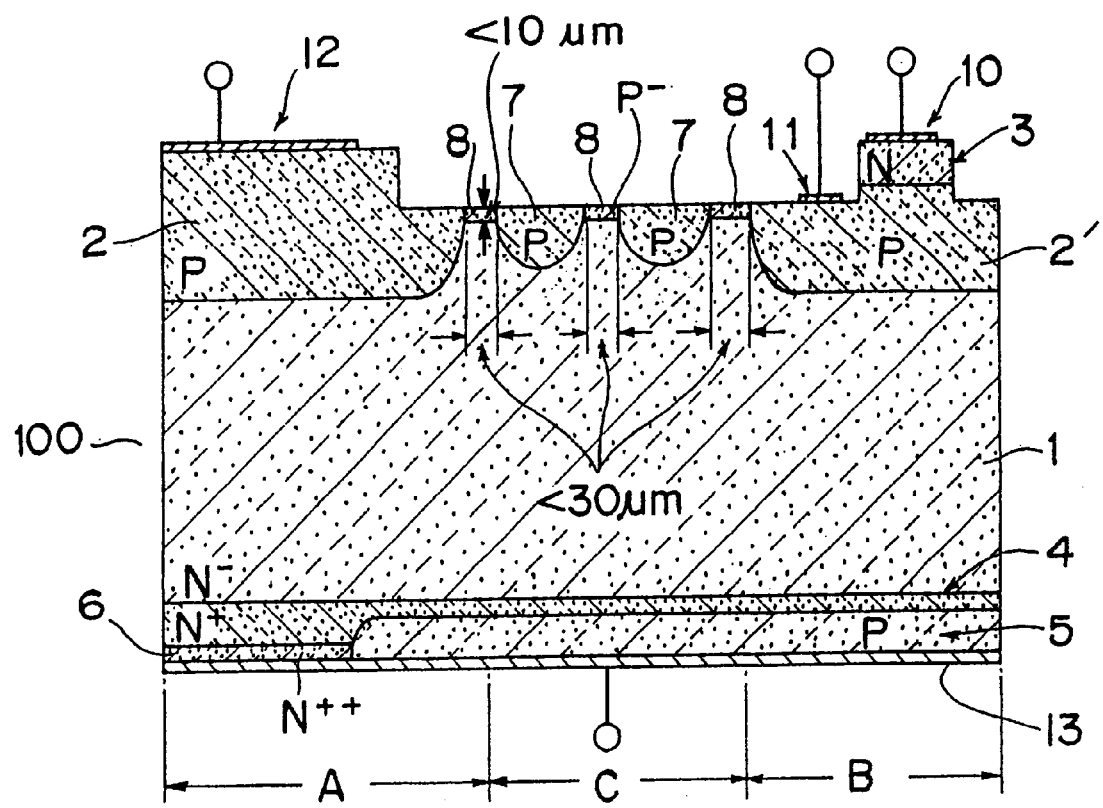
FIG. 7 is a cross sectional view of the reverse conducting thyristor according to the third example of the present invention.
Figure 8:
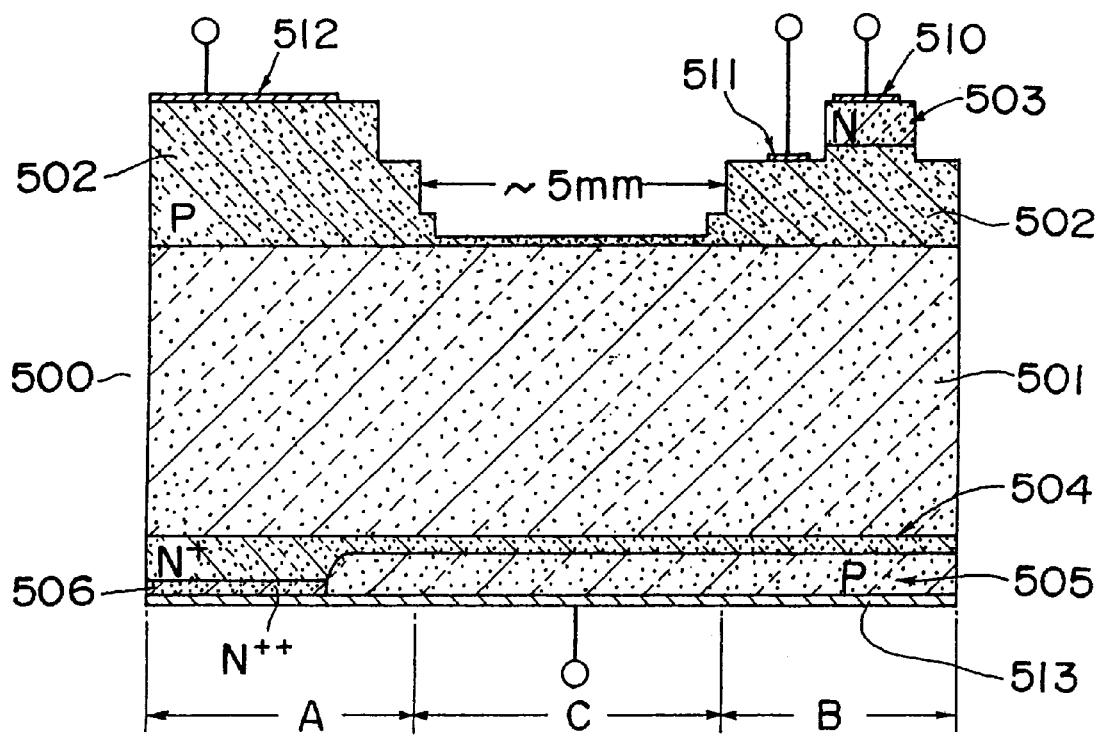
FIG. 8 is a cross sectional view of the conventional reverse conducting thyristor.
Figure 9:
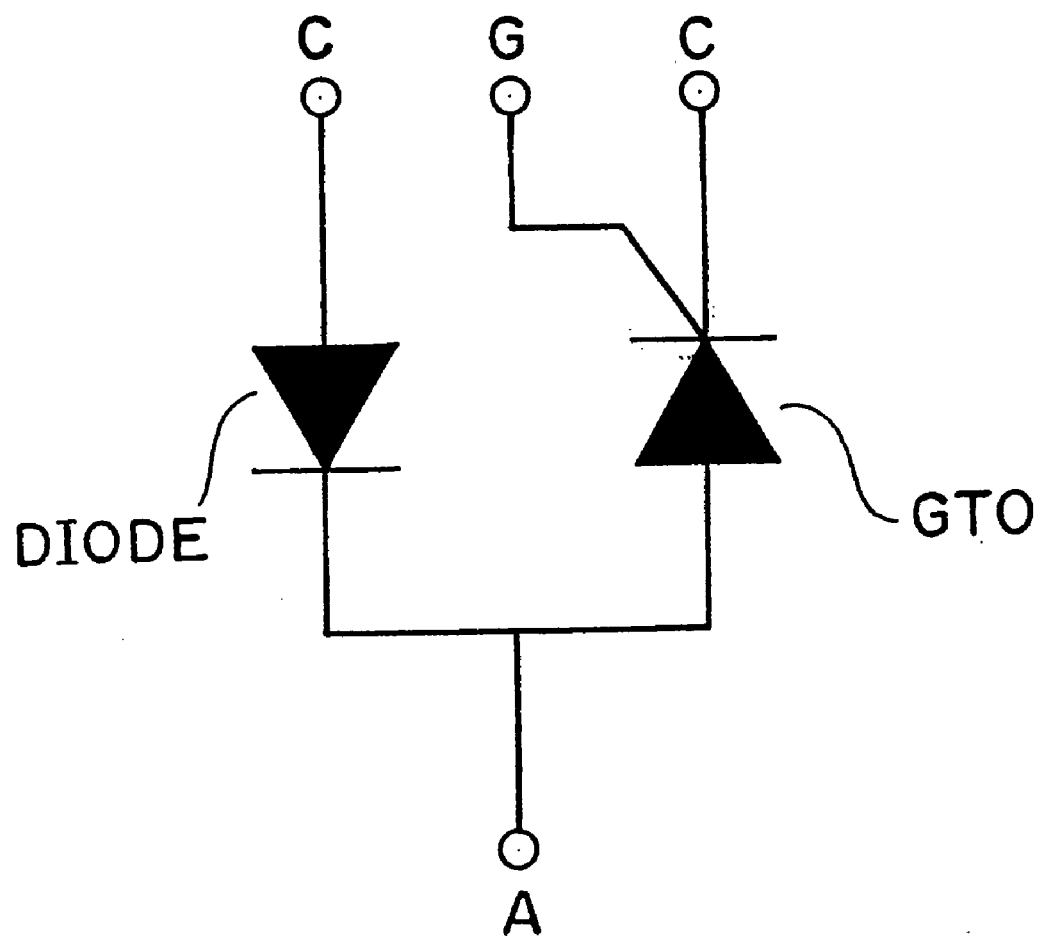
FIG. 9 is a circuitry diagram of the conventional reverse conducting thyristor.

FIG. 7 shows a third example of the invention. A structure of a reverse conducting thyristor 100 is the same as that of the thyristor shown in FIG. 1. In the reverse conducting thyristor 100 shown in FIG. 7, the separation portion C includes two guard ring regions 7, and the gaps between the guard ring regions 7 and the p layer 2 and the like are respectively 30 μm or narrower. Further, the concentrations of the p-type impurities in the guard ring regions 7, the p layer 2 and the p base layer 2', and the thin film regions 8 are progressively lower in this order.

Further, the depth of the guard ring regions 7 is shallower than the p layer 2 and the p base layer 2'.

This is to suppress maximum values of electric fields between P, N and P due to growth of a depletion layer on the cathode side to the guard ring regions 7, by means of the shallow guard ring regions 7.

That is, there is a tendency that the deeper the guard ring regions 7 are, the higher the electric fields created between P, N and P are, whereas the shallower the guard ring regions 7 are, the more the electric fields are moderated. Further, there is a tendency that the electric fields created between the deep regions are high and those between the shallow regions are low.

Hence, with the shallow guard ring regions 7, it is possible to decrease the electric fields created between P, N and P.

What is claimed is:

1. A reverse conducting thyristor in which a diode and a thyristor are reverse parallel-connected and formed on the same substrate, comprising:

a semiconductor substrate of a first conductivity type;

a diode region of a second conductivity type of said diode, formed in a major surface of said semiconductor substrate; and a base region of the second conductivity type of said thyristor, formed in said major surface of said semiconductor substrate so as to be separated from said diode region of the second conductivity type by a separation region, wherein said separation region includes a thin film region of the second conductivity type formed in said major surface of said semiconductor substrate and a guard ring region of the second conductivity type.

2. The reverse conducting thyristor according to claim 1, wherein both a distance between said guard ring region and said diode region of the second conductivity type and a distance between said guard ring region and said base region of the second conductivity type are respectively 30 μm or smaller.

3. The reverse conducting thyristor according to claim 1, wherein the depth of said guard ring region is smaller than the depth of said diode region of the second conductivity type and the depth of said base region of the second conductivity type.

4. The reverse conducting thyristor according to claim 1, wherein there are two or more such guard ring regions.

5. The reverse conducting thyristor according to claim 4, wherein a distance between said guard ring regions is 30 μm or smaller.

6. The reverse conducting thyristor according to claim 1, wherein the depth of said thin film region is 10 μm or smaller.

7. The reverse conducting thyristor according to claim 1, wherein a concentration of an impurity of the second conductivity type contained in said thin film region is lower than concentrations of impurities of the second conductivity type contained in said diode region of the second conductivity type and said base region of the second conductivity type.

8. The reverse conducting thyristor according to claim 1, wherein a concentration of an impurity of the second conductivity type contained in said guard ring region is higher than concentrations of impurities of the second conductivity type contained in said diode region of the second conductivity type and said base region of the second conductivity type.

9. The reverse conducting thyristor according to claim 1, wherein concentrations of impurities of the second conductivity type contained in said guard ring region, said diode region and said base region of the second conductivity type, and said thin film region are progressively lower in this order.

* * * * *